(12) United States Patent
Cheng et al.

(10) Patent No.: US 8,967,368 B2
(45) Date of Patent: Mar. 3, 2015

(54) APPARATUS FOR PROCESSING ELECTRONIC DEVICES

(71) Applicants: Chi Wah Cheng, Tsing Yi (HK); Kai Fung Lau, Hong Kong (HK)

(72) Inventors: Chi Wah Cheng, Tsing Yi (HK); Kai Fung Lau, Hong Kong (HK)

(73) Assignee: ASM Technology Singapore Pte Ltd, Singapore (SG)

( * ) Notice: Subject to any disclaimer, the term of this patent is extended or adjusted under 35 U.S.C. 154(b) by 0 days.

(21) Appl. No.: 14/047,143

(22) Filed: Oct. 7, 2013

(65) Prior Publication Data

US 2014/0102850 A1    Apr. 17, 2014

Related U.S. Application Data

(60) Provisional application No. 61/712,969, filed on Oct. 12, 2012.

(51) Int. Cl.
*B65G 29/00* (2006.01)
*B65G 47/84* (2006.01)
*H01L 21/677* (2006.01)

(52) U.S. Cl.
CPC .............. *B65G 29/00* (2013.01); *B65G 47/846* (2013.01); *H01L 21/677* (2013.01)
USPC ................... 198/470.1; 198/339.1; 198/478.1

(58) Field of Classification Search
CPC .............................. B65G 29/00; B65G 47/846
USPC ............ 198/339.1, 470.1, 476.1, 477.1, 478.1
See application file for complete search history.

(56) References Cited

U.S. PATENT DOCUMENTS

| | | | | |
|---|---|---|---|---|
| 7,757,835 | B2 * | 7/2010 | Garthaffner et al. | .......... 198/392 |
| 2013/0180827 | A1 * | 7/2013 | Cieslikowski et al. | .... 198/479.1 |

FOREIGN PATENT DOCUMENTS

JP         2006-306617         11/2006

* cited by examiner

*Primary Examiner* — Leslie A Nicholson, III
(74) *Attorney, Agent, or Firm* — Ostrolenk Faber LLP (57) ABSTRACT

An apparatus for processing electronic devices includes a rotary turret having first device concentric around the rotary turret, which transfer the electronic devices; a rotary wheel having second device holders concentric around the rotary wheel, which receive the electronic devices and a processing device to process the electronic devices. The rotary turret rotates the first device holders along a first circular path, and the rotary wheel rotates the second device holders along a second circular path. The first axis of the rotary turret is perpendicular to the second axis of the rotary wheel, and that a projection of the second circular path of the second device holders in a direction perpendicular to the second axis of the rotary wheel onto the first circular path of the first device holders defines a line from the inside to the outside of the first circular path of the first device holders.

13 Claims, 7 Drawing Sheets

APPARATUS FOR PROCESSING ELECTRONIC DEVICES

CROSS REFERENCE TO RELATED APPLICATION

This application claims the benefit and priority of U.S. Provisional Application Ser. No. 61/712,969 filed on 12 Oct. 2012 entitled "An apparatus for processing electronic devices", the disclosure of which is incorporated herein by reference.

FIELD OF THE INVENTION

This invention relates to an apparatus for processing electronic devices, and particularly but not exclusively, to a package handler for testing or processing semiconductor devices.

BACKGROUND OF THE INVENTION

During the assembly and packaging of semiconductor devices, a package handler is used to test or process semiconductor packages (e.g. comprising IC chips). Typically, the package handler transfers the semiconductor packages from an input position to one or more stations for testing or processing. Subsequently, the semiconductor packages are transferred by the package handler from the one or more stations to an output position for further downstream processing or binning. In order to transfer the semiconductor packages from the input position to the one or more stations, and subsequently to the output position, the package handler usually includes a transfer mechanism for this purpose.

Figure 1:
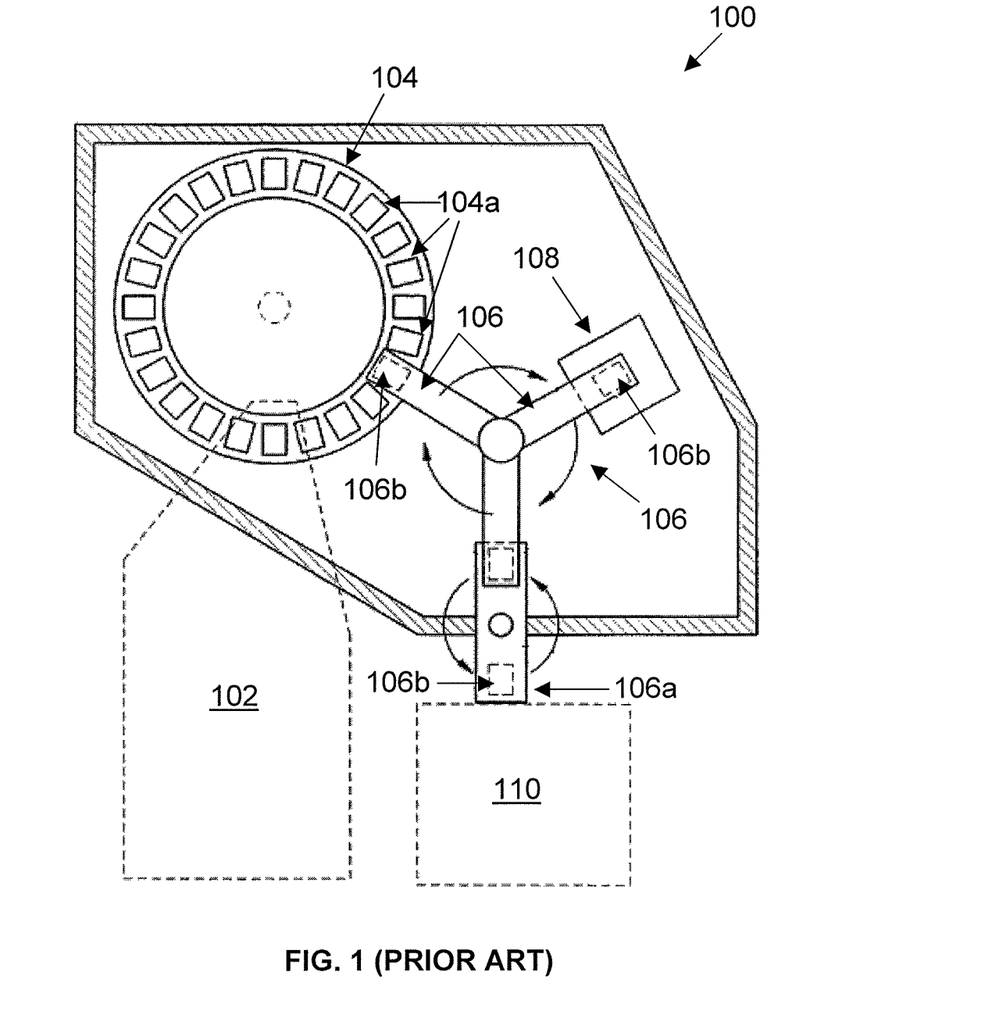
FIG. 1 shows a conventional package handler.

FIG. 1 shows a conventional package handler 100, comprising: i) an input buffer 102 having a supply of untested/unprocessed semiconductor packages; ii) a rotary turret 104 having multiple device holders 104a for holding semiconductor packages; iii) a transfer mechanism (shown as a rotary device 106 having a plurality of radially-extending arms 106a with suction nozzles 106b) for holding and transferring semiconductor packages; iv) a testing/processing station 108; and v) and an output buffer 110 for storing tested/processed semiconductor packages. Specifically, untested/unprocessed semiconductor packages are transferred by the device holders 104a of the rotary turret 104 from the input buffer 102 to the rotary device 106. The suction nozzle 106b of a first of the rotary device arms 106a is initially positioned over one of the device holders 104a to transfer a corresponding semiconductor package from the rotary turret 104 to the rotary device 106. Simultaneously, the suction nozzle 106b of a second of the rotary device arms 106a is positioned over the testing/processing station 108 to transfer another semiconductor package at the rotary device arm 106a to and from the testing/processing station 108 for testing/processing. Similarly, the suction nozzle 106b of a third of the rotary device arms 106a is positioned over the output buffer 110 to transfer a tested/processed semiconductor package that is held thereto to the output buffer 110 for further downstream processing or binning. Since the rotary device 106 is horizontally disposed within the package handler 100, the required space for housing the transfer mechanism of the package handler 100 may undesirably lead to a large machine footprint.

One way to reduce the space required for housing the transfer mechanism of the package handler 100 is by tilting the rotary device 106 at an acute angle with respect to the rotational plane on which the rotary turret 104 rotates. For example, Japanese patent publication 2006-306617 discloses an electronic parts processing device comprising a satellite table for transferring electronic parts from a turntable to a marking unit, wherein the satellite table is tilted at an acute angle with respect to the rotational plane of the turntable at the outer side of the same. However, since the satellite table is still substantially disposed horizontally within the electronic parts processing device, a large machine footprint is nevertheless still required.

Thus, it is an object of the present invention to seek to provide an apparatus for processing electronic devices that addresses the undesirability of the conventional package handlers as described.

SUMMARY OF THE INVENTION

A first aspect of the invention is defined in claim 1. By providing such a relative arrangement between the rotary turret and the rotary wheel to maximise the use of a particular three-dimensional space, the maximum number of second device holders of the rotary wheel can be advantageously increased to accommodate more processing devices for processing the electronic devices.

Some preferred but optional features of the apparatus have been defined in the dependent claims.

BRIEF DESCRIPTION OF THE DRAWINGS

Preferred embodiments of the invention will now be described, by way of example only, with reference to the accompanying drawings, of which:

FIG. 3a shows a perspective view of the transfer mechanism of the package handler of FIG. 2, while FIG. 3b shows a cross-section of the transfer mechanism as viewed along a section A-A' indicated in FIG. 3a;

FIG. 4a shows the laser marker of the package handler of FIG. 2 in a locked position during operation, while

FIG. 5a shows a different configuration of the laser marker in a locked position during operation, while

DETAILED DESCRIPTION OF THE PREFERRED EMBODIMENTS

Figure 2A:
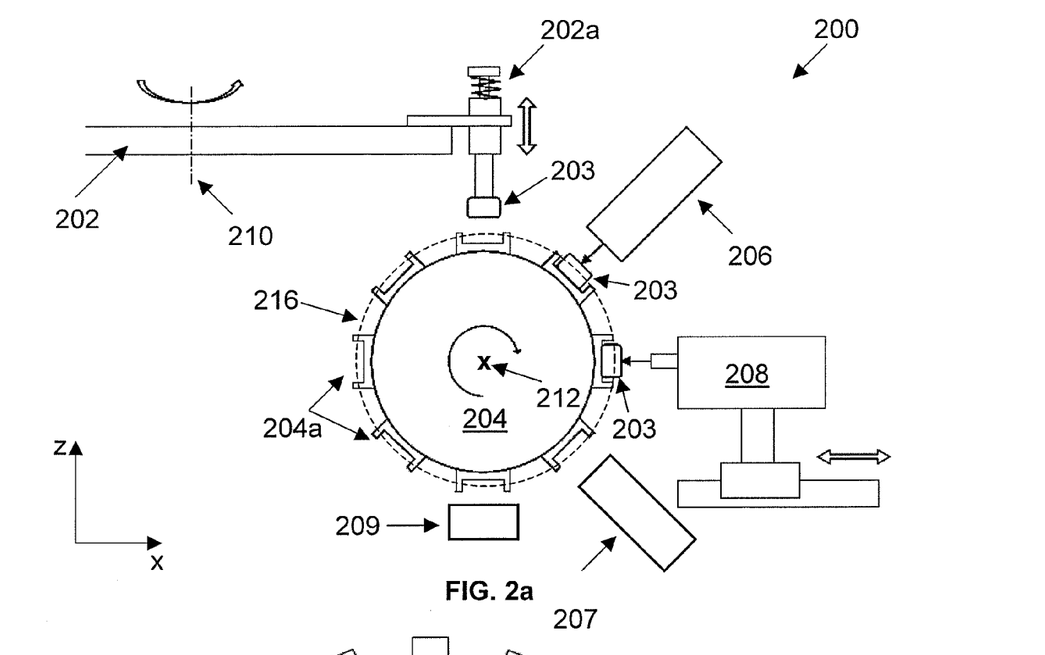
FIG. 2a and FIG. 2b are respective side and top views of a package handler according to a preferred embodiment of the invention, comprising a transfer mechanism and a laser marker.

FIG. 2a is a sectional side view of a package handler 200 according to a preferred embodiment of this invention, comprising: i) a rotary turret 202 having a plurality of first device holders 202a for holding and transferring electronic devices (shown as semiconductor packages 203); ii) a rotary device transfer mechanism (shown as a rotary wheel 204) having a plurality of second device holders 204a for holding and transferring the semiconductor packages 203; iii) a pre-marking inspection device 206 for verifying a surface condition of the semiconductor packages 203 for laser marking; iv) a laser marker 208 for laser-marking the semiconductor packages 203; v) a post-marking inspection device 207 for determining the laser marking quality on the semiconductor packages 203; and vi) a rejection bin 209 for collecting the semiconductor packages 203 that have not been properly laser-marked.

The rotary turret 202 is operative to rotate about a first axis 210 that extends perpendicularly into the xy-plane for transferring the semiconductor packages 203 from an input buffer (not shown) to the rotary wheel 204. Further, each of the first device holders 202a is operative to move vertically along the z-axis to place a semiconductor package 203 on, and to pick a semiconductor package 203 from, a respective second device holder 204a of the rotary wheel 204.

Similarly, the rotary wheel 204—arranged below the rotary turret 202 in a normal operative position of the package handler 200—is operative to rotate about a second axis 212 that extends perpendicularly into the xz-plane, such that the second device holders 204a rotate on the xz-plane to receive the semiconductor packages 203 from the first device holders 202a of the rotary turret 202 for sequential transfer to the pre-marking inspection device 206, the laser marker 208, the post-marking inspection device 207, and/or the rejection bin 209. From the arrangement of the rotary turret 202 and the rotary wheel 204, it can be noted that the second axis 212 of the rotary wheel 204 is arranged perpendicularly with respect to both the first axis 210 of the rotary turret 202 and the xz-plane. Nevertheless, it should be appreciated that the second axis 212 of the rotary wheel 204 may also be inclined at different angles with respect to the xz-plane.

The second device holders 204a are concentrically arranged around the rotary wheel 204 and, more specifically, on an outermost circumferential edge of the rotary wheel 204. Referring to FIG. 2a, it can be seen that eight second device holders 204a are radially and evenly distributed on the outermost circumferential edge of the rotary wheel 204 by a separation angle of 45 degrees. However, it should be appreciated that the rotary wheel 214 may have any technically-feasible number of second device holders 204a as desired.

With such a relative arrangement of the rotary turret 202 and the rotary wheel 204, the size for housing the rotary turret 202 and the rotary wheel 204 within the package handler 200 can be advantageously reduced due to optimization of a certain three-dimensional ('3D') processing space (see explanation in the immediate proceeding paragraph). Consequently, more processing devices (e.g. the pre- and post-marking inspection devices 206, 207, the laser maker 208, and the rejection bin 209) can be accommodated within the certain 3D processing space.

The laser marker 208 is arranged on a common plane on which the second device holders 204a of the rotary wheel 204 rotate. Moreover, the arrangement of the second device holders 204a on the outermost circumferential edge of the rotary wheel 204 allows the pre-marking inspection device 206, the laser marker 208, the post-marking inspection device 207, and the rejection bin 209 to be mutually separated by an angle of 45 degrees from each other on the xz-plane, to process the semiconductor packages 203 for laser marking. This prevents "crowding out" of the components of the package handler 200 on the xy-plane, by arranging those components in the space above or below the horizontal plane on the xz-plane. Thus, the package handler 200 would require a smaller machine footprint than the conventional package handler 100.

Figure 2B:
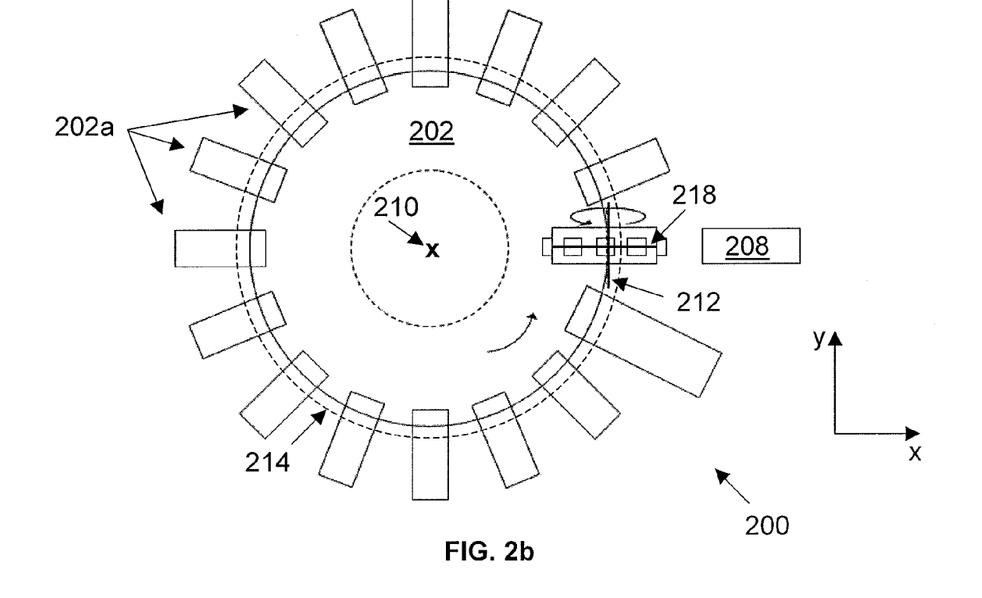

FIG. 2b is a top view of the package handler 200. It can be seen that the first device holders 202a are also concentrically arranged around the rotary turret 202, and more specifically, on an outermost circumferential edge of the rotary turret 202. In particular, the first device holders 202a move along a first circular path 214 on the xy-plane when the rotary turret 202 rotates about the first axis 210. On the other hand, the second device holders 202 move along a second circular path 216 on the xz-plane when the rotary wheel 204 rotates about the second axis 212 (see FIG. 2a). From the arrangement of the rotary turret 202 and the rotary wheel 204, it can thus be appreciated that a projection of the second circular path 216 of the second device holders 204a in a direction perpendicular to the second axis 212 of the rotary wheel 204 onto the first circular path 214 of the first device holders 202a defines a line 218 between the inside and the outside of the first circular path 214 of the first device holders 202a.

Figure 3A:
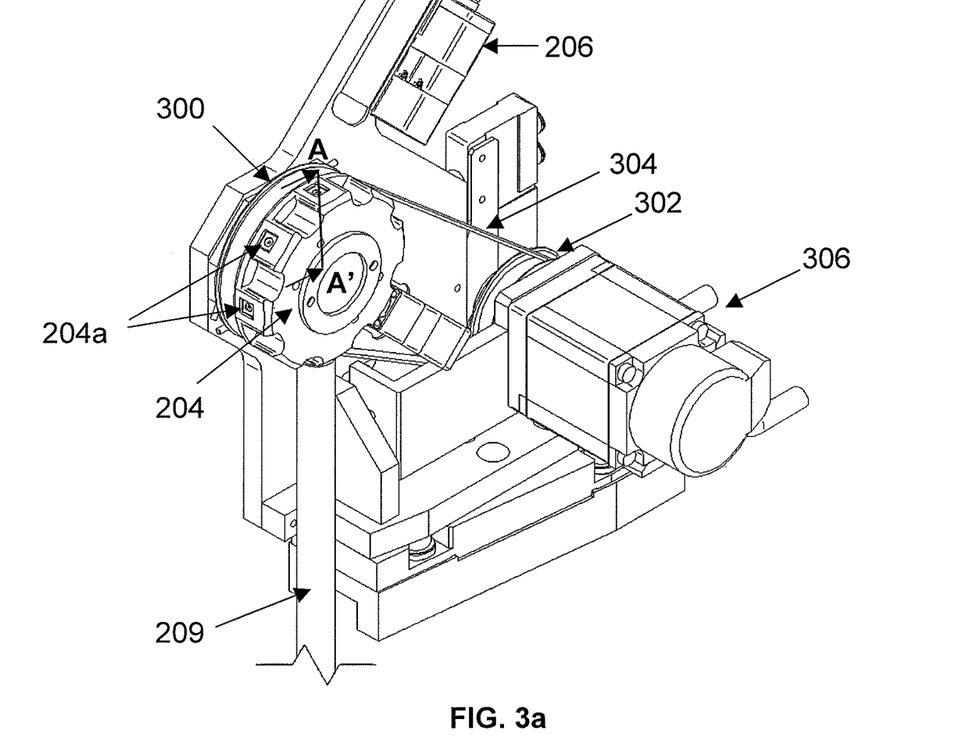

FIG. 3a is a perspective view of the package handler 200. For the sake of explanation, the rotary turret 202 and the laser marker 208 have been omitted from FIG. 3a. It can be seen that the rotary wheel 204 is connected to a passive pulley 300, which is in turn connected via a timing belt 304 to an active pulley 302 that is driven by a motor 306. Consequently, the rotary wheel 204 can be rotated and indexed by the motor 306 between discrete positions that are 45 degrees apart.

Figure 3B:
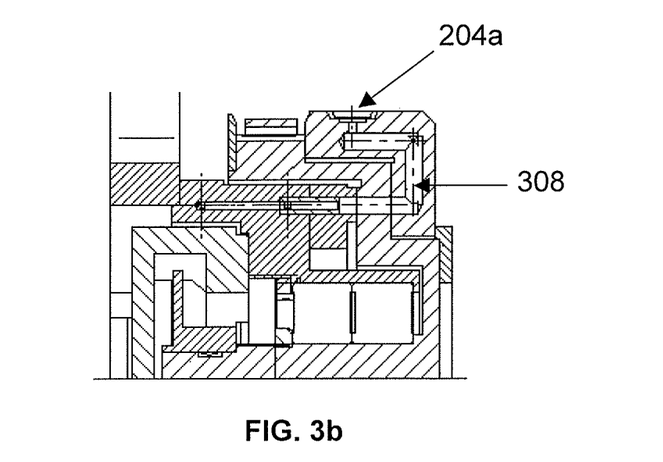

FIG. 3b shows a cross-section of the rotary wheel 204 as viewed along section A-A' indicated in FIG. 3a. In particular, it is seen that each of the second device holders 204a of the rotary wheel 204 is in fluid communication with a vacuum path 308 that is connected to a vacuum source (not shown). It should be appreciated that the suction force generated at each of the second device holders 204a should be strong enough to at least hold the weight of a semiconductor package 203 as well as a centrifugal force acting thereon, especially since the rotary wheel 204 will rotate to turn the semiconductor package 203 upside down when the corresponding second device holder 204a rotates to a position at the bottom of the rotary wheel 204 during laser marking. Further, it should be appreciated that the suction force generated at each of the second device holders 204a should also be individually and separately controlled. In this way, the semiconductor packages 203 that have not been properly laser-marked can be dropped into the rejection bin 209 by switching off the suction force at the respective second device holders 204a, whereas the semiconductor packages 203 that have been properly laser-marked can continue to be held by the respective second device holders 204a by maintaining the suction force at those respective second device holders 204a.

Figure 4A:
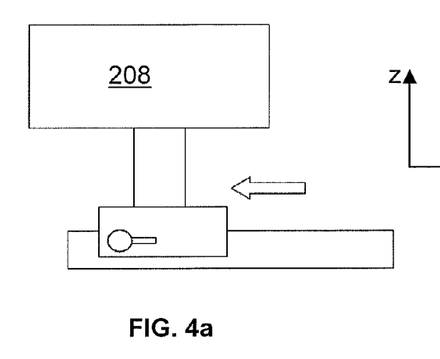
Figure 4B:
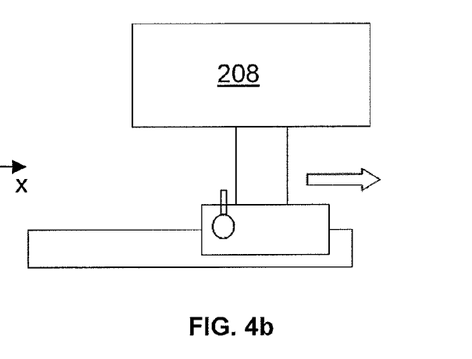
FIG. 4b shows the laser marker in an unlocked position suitable for performing maintenance of the package handler.

In order to prevent any accidental movement of the laser marker 208 during laser marking, the laser marker 208 may be locked in an operational position, as shown in FIG. 4a. By unlocking the laser marker 208, the laser marker 208 can be moved along the x-axis as shown in FIG. 4b to increase the space for facilitating maintenance and/or cleaning of the package handler 200.

Figure 5A:
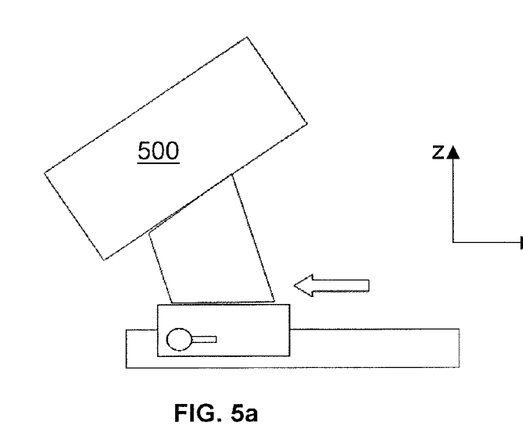
Figure 5B:
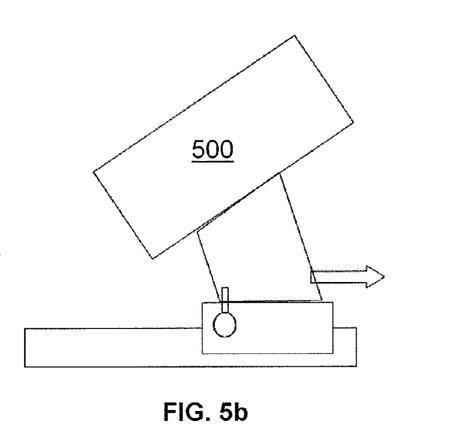
FIG. 5b shows the laser marker in an unlocked position suitable for performing maintenance.

FIG. 5a and FIG. 5b show a laser marker 500 according to a different configuration. Similar to the laser marker 208 of FIG. 4a and FIG. 4b, however, this laser marker 500 can also be locked in position during laser marking as shown in FIG. 5a, and unlocked for motion along the x-axis as shown in FIG. 5b to facilitate maintenance and/or cleaning. However, and in contrast to the laser marker 208 of FIG. 4a and FIG. 4b, the laser marker 500 is tilted at an angle (shown as 45 degrees) instead of being arranged perpendicularly with respect to the vertical z-axis. Thus, such a configuration of the laser marker 208 may replace the pre-marking inspection device 206 in embodiments of the package handler 200 where pre-marking inspection is not necessary.

Figure 6A:
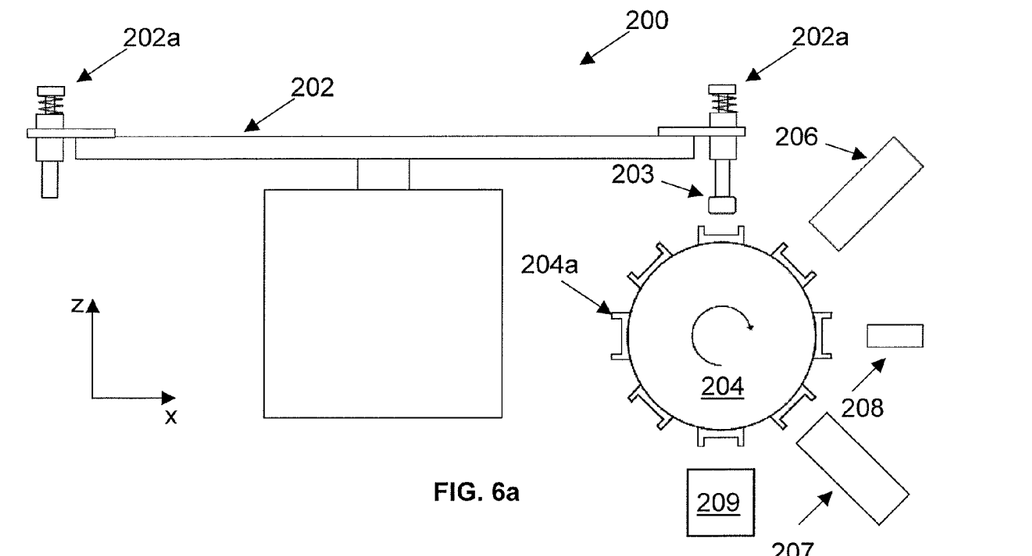
FIGS. 6a-6e show an operation of the package handler of FIG. 2.

An operation of the package handler 200 will now be described with reference to FIGS. 6a to 6e. FIG. 6a shows that the package handler 200 is operative to position a starting first device holder 202a of the rotary turret 202 (holding a semiconductor package 203) directly above a starting second device holder 204a at the top of the rotary wheel 204 (which is not holding any semiconductor package 203), before the starting first device holder 202a is lowered to place the semiconductor package 203 onto the starting second device holder 204a. The suction force at the starting second device holder 204a should be activated at this time to provide sufficient force to hold the semiconductor package 203 securely thereto.

Figure 6B:
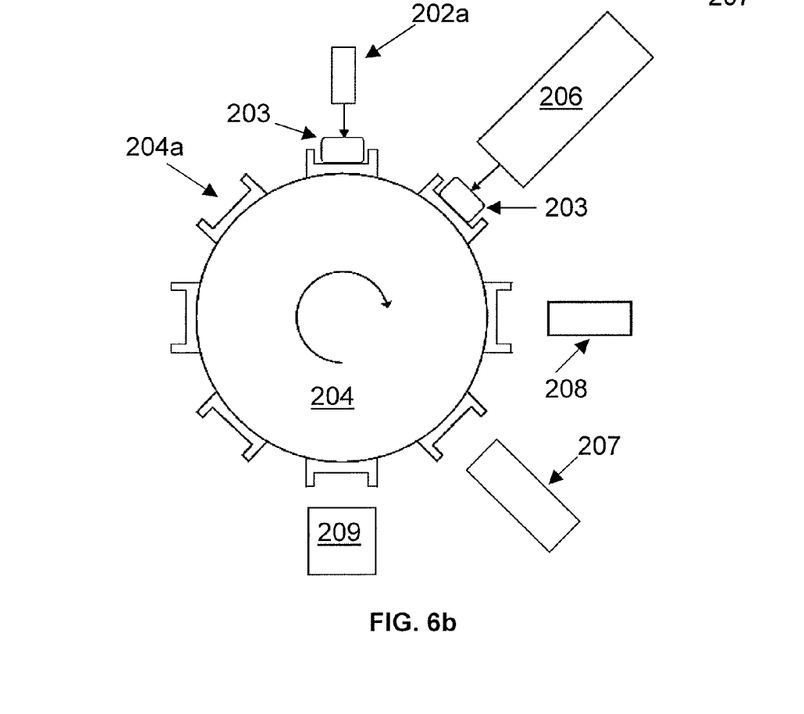

The rotary wheel 204 is then indexed to rotate clockwise about its axis 212 by 45 degrees while the starting first device holder 202a remains in its lowered position. Accordingly the starting first device holder 202a will be aligned along a field of vision of the pre-marking inspection device 206 as shown in FIG. 6b, to determine a relative position of the semiconductor package 203 on the starting second device holder 204a. Further, a second device holder 204a adjacent to the starting second device holder 204a will be positioned directly below the starting first device holder 202a. If a semiconductor package 203 is held by the adjacent second device holder 204a, the starting first device holder 202a would pick up the semiconductor package 203 therefrom. The suction force at the adjacent second device holder 204a may be deactivated at this time to assist in the pickup of the semiconductor package 203 by the starting first device holder 202a. Optionally, the pressure at the adjacent second device holder 204a may be switched from the original negative vacuum pressure to a positive pressure to further assist in the pickup of the semiconductor package 203 by the starting first device holder 202a. Thereafter, the rotary turret 202 is indexed to rotate about its axis 210 so that a first device holder 204a adjacent to the starting first device holder 202a is now positioned directly above the adjacent second device holder 204a (which is not holding any semiconductor package 203), before the adjacent first device holder 204a is lowered to place a different semiconductor package 203 onto the adjacent second device holder 204a, as shown in FIG. 6b.

Figure 6C:
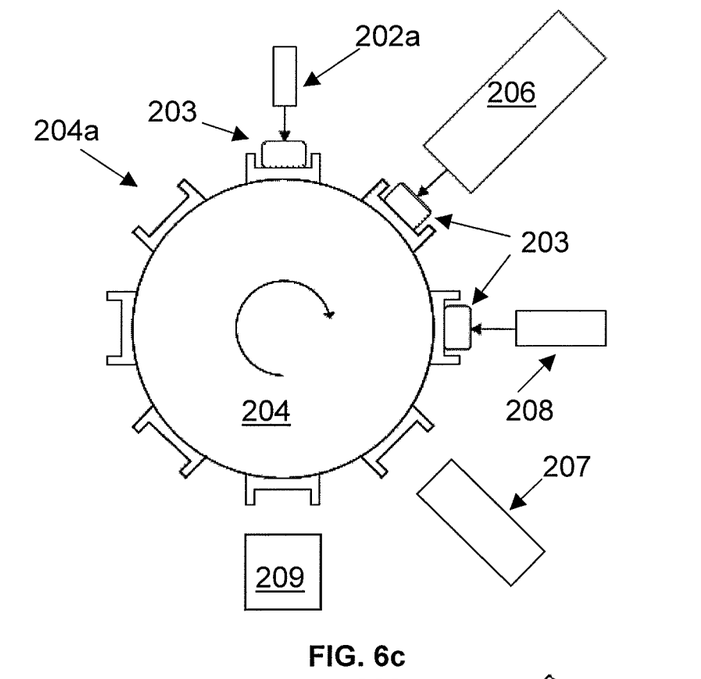

Subsequently, the rotary wheel 204 is indexed again to rotate clockwise about its axis 212 by another 45 degrees so that the starting second device holder 204a is aligned with the laser marker 208, as shown in FIG. 6c. The laser maker 208 is then activated to laser-mark a surface of the semiconductor package 203, based on the relative position between the semiconductor package 203 and the starting second device holder 204a as has been determined by the pre-inspection device 206.

Likewise, if a semiconductor package 203 is held by the second device holder 204a at the top of the rotary wheel 204, the adjacent first device holder 202a would pick up the semiconductor package 203, before the rotary turret 202 is indexed by another position to place a further semiconductor package 203 on the second device holder 204a at the top of the rotary wheel 204, as shown in FIG. 6c.

Figure 6D:
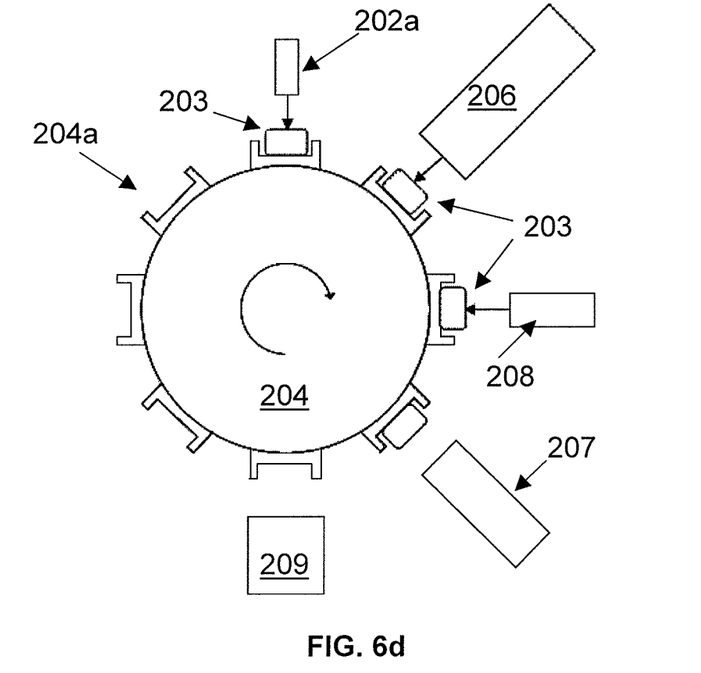
Figure 6E:
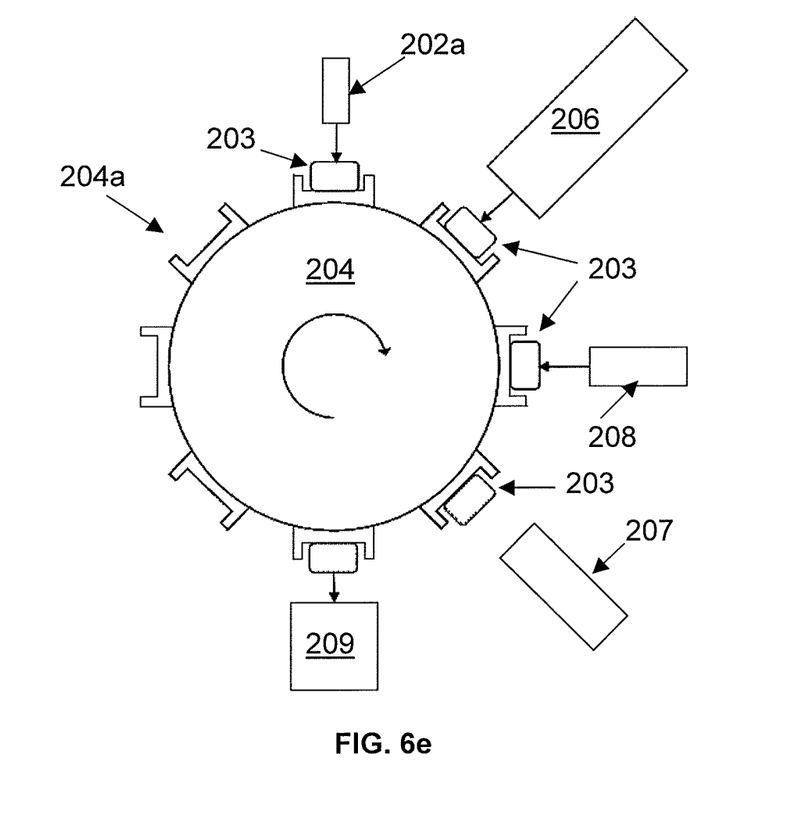

FIG. 6d shows the rotary wheel 204 being further indexed to align the semiconductor package 203 at the starting second device holder 204a with the post-inspection device 207, which determines the laser marking quality on the semiconductor package 203. If the semiconductor package 203 is determined as not having been properly laser-marked, then when the rotary wheel 204 is indexed to its next position, the starting second device holder 204a would be operative to reject the semiconductor package 203 therefrom and into the rejection bin 209, as shown in FIG. 6e.

Having fully described the invention, it should be apparent to one of ordinary skill in the art that many modifications can be made thereto without departing from the scope of the invention as claimed. For instance, it should be envisaged that the package handler 200 may include more than one rejection bin 209 for receiving and storing semiconductor packages 203 that have not been properly laser-marked. In addition, the laser marker 208 and/or the pre- and post-inspection devices 206, 207 may also be aligned and orientated at other positions with respect to the outer circumferential edge of the rotary wheel 204. Further, the rotary wheel 204 may also take the form of a plurality of radially-extending arms as in the case of the conventional package handler 100 shown in FIG. 1. In addition, the laser marker 208 may be omitted from the package handler 200. For instance, the package handler 200 may just include an inspection device that is operative to inspect a surface of the semiconductor packages 203 and the rejection bin 209 for discarding semiconductor packages 203 that do not meet the desired visual requirement(s). Alternatively, the package handler 200 may include a testing device for testing one or more operational characteristics of the semiconductor packages 203 (e.g. LEDs). Furthermore, the package handler 200 may include a cleaning device operative to clean the semiconductor packages 203. Such a cleaning device may comprise a brush having bristles made from, for example, horse hair or pig hair, wherein the cleaning device is arranged such that the bristles brush against a surface of the semiconductor packages 203 as the rotary wheel 204 rotates.

The invention claimed is:

1. An apparatus for processing electronic devices, the apparatus comprising:
   a rotary turret having first device holders that are concentrically arranged around the rotary turret, the first device holders being for transferring the electronic devices;
   a rotary wheel having second device holders that are concentrically arranged around the rotary wheel, the second device holders being for receiving the electronic devices from the first device holders to be processed; and
   a processing device arranged on a common plane on which the second device holders are operative to rotate, the processing device being configured to process the electronic devices,
   wherein the rotary turret is rotatable about a first axis to move the first device holders along a first circular path, and the rotary wheel is rotatable about a second axis to move the second device holders along a second circular path, the rotary turret and the rotary wheel being arranged such that the second axis of the rotary wheel is perpendicular to the first axis of the rotary turret, and that a projection of the second circular path of the second device holders in a direction perpendicular to the second axis of the rotary wheel onto the first circular path of the first device holders defines a line from the inside to the outside of the first circular path of the first device holders.

2. The apparatus of claim 1, wherein the second device holders are radially arranged on an outermost circumferential edge of the rotary wheel.

3. The apparatus of claim 2, wherein the second device holders are evenly distributed on the outermost circumferential edge of the rotary wheel.

4. The apparatus of claim 1, wherein the rotary wheel is arranged below the rotary turret at a normal operative position of the apparatus.

5. The apparatus of claim 1, wherein the at least one processing device includes a laser marker.

6. The apparatus of claim 5, wherein the laser marker is arranged perpendicular to the first axis of the rotary turret.

7. The apparatus of claim 5, wherein the laser marker is inclined at an angle with respect to the first axis of the rotary turret.

8. The apparatus of claim 5, wherein the at least one processing device further comprises a pre-marking inspection device for verifying a surface condition of the electronic devices for laser marking.

9. The apparatus of claim 5, wherein the at least one processing device further comprises a post-marking inspection device for determining the laser marking quality on the respective surfaces of the electronic devices.

10. The apparatus of claim 9, wherein the at least one processing device further comprises a rejection bin for receiving and storing the electronic devices that have not been properly laser marked as determined by the post-marking inspection device.

11. The apparatus of claim 1, wherein the at least one processing device comprises an inspection device operative to inspect a surface of the electronic devices.

12. The apparatus of claim 1, wherein the at least one processing device comprises a testing device for testing at least one operational characteristic of the electronic devices.

13. The apparatus of claim 1, wherein the at least one processing device comprises a cleaning device operative to clean a surface of the electronic devices.

* * * * *